(12) United States Patent
Sakai

(10) Patent No.: US 9,768,374 B2
(45) Date of Patent: Sep. 19, 2017

(54) METHOD OF MANUFACTURING CYLINDRICAL PIEZOELECTRIC ELEMENT

(71) Applicant: OLYMPUS CORPORATION, Tokyo (JP)

(72) Inventor: Nagahide Sakai, Higashimurayama (JP)

(73) Assignee: OLYMPUS CORPORATION, Tokyo (JP)

( * ) Notice: Subject to any disclaimer, the term of this patent is extended or adjusted under 35 U.S.C. 154(b) by 534 days.

(21) Appl. No.: 14/219,178

(22) Filed: Mar. 19, 2014

(65) Prior Publication Data

US 2014/0203690 A1 Jul. 24, 2014

Related U.S. Application Data

(63) Continuation of application No. PCT/JP2012/075689, filed on Oct. 3, 2012.

(30) Foreign Application Priority Data

Oct. 3, 2011 (JP) .................................. 2011-219148

(51) Int. Cl.
*H01L 41/047* (2006.01)
*H01L 41/257* (2013.01)
(Continued)

(52) U.S. Cl.
CPC ........ *H01L 41/0475* (2013.01); *H01L 41/047* (2013.01); *H01L 41/092* (2013.01);
(Continued)

(58) Field of Classification Search
CPC . H01L 41/047; H01L 41/0475; H01L 41/092; H01L 41/107; H01L 41/193;
(Continued)

(56) References Cited

U.S. PATENT DOCUMENTS 4,578,442 A * 3/1986 Ohigashi ............... H01L 41/193
252/62.9 R
5,725,825 A * 3/1998 Hotomi ................. H01L 41/333
264/125
5,892,318 A * 4/1999 Dai ....................... H01L 41/107
310/357

FOREIGN PATENT DOCUMENTS

JP 2-65185 A 3/1990
JP 2-113104 A 9/1990
(Continued)

OTHER PUBLICATIONS

Machine Translation of Japanese Patent Publication, JP 7-106661, by EPO/Google, Oct. 2016.*
(Continued)

*Primary Examiner* — A. Dexter Tugbang
(74) *Attorney, Agent, or Firm* — Scully, Scott, Murphy & Presser, P.C.

(57) ABSTRACT

In manufacturing method of a cylindrical piezoelectric element, a cylindrical piezoelectric material is formed by molding a piezoelectric material into a cylindrical shape and subjecting the molded piezoelectric material to calcination. A reference electrode is provided on an inner circumferential surface of the cylindrical piezoelectric material. Drive electrodes are provided in a circumferential direction so that the drive electrodes are extending in an axial direction from one end to the other end on an outer circumferential surface. A polarization electrode is provided at a part of the circumferential surface in the vicinity of the one end. A predetermined voltage is applied between the polarization electrode and the reference electrode. The polarization electrode is removed from the cylindrical piezoelectric material.

5 Claims, 8 Drawing Sheets

(51) Int. Cl.
  *H01L 41/107* (2006.01)
  *H01L 41/193* (2006.01)
  *H01L 41/09* (2006.01)
  *H01L 41/29* (2013.01)
  *H01L 41/335* (2013.01)
  *H01L 41/333* (2013.01)

(52) U.S. Cl.
  CPC .......... *H01L 41/107* (2013.01); *H01L 41/193* (2013.01); *H01L 41/257* (2013.01); *H01L 41/29* (2013.01); *H01L 41/333* (2013.01); *H01L 41/335* (2013.01); *Y10T 29/42* (2015.01); *Y10T 29/49005* (2015.01); *Y10T 29/49147* (2015.01)

(58) Field of Classification Search
  CPC ..... H01L 41/257; H01L 41/29; H01L 41/333; H01L 41/335; Y10T 29/42; Y10T 29/49005; Y10T 29/49147
  See application file for complete search history.

(56) References Cited

FOREIGN PATENT DOCUMENTS

| JP | 5-343759 A | 12/1993 |
|----|------------|---------|
| JP | 07106661 A | 4/1995 |
| JP | 7-287022 A | 10/1995 |
| JP | 09327092 A * | 12/1997 |
| JP | 2003-46159 A | 2/2003 |
| JP | 2009152557 A | 7/2009 |
| JP | 2009-212519 A | 9/2009 |

OTHER PUBLICATIONS

International Preliminary Report on Patentability together with the Written Opinion of the International Searching Authority from related International Application No. PCT/JP2012/075689, dated Apr. 17, 2014.

Japanese Office Action dated Jan. 20, 2015 with English translation received in related Patent Application No. 2011-219148.

International Search Reports dated Nov. 6, 2012 issued in PCT/JP2012/075689.

* cited by examiner

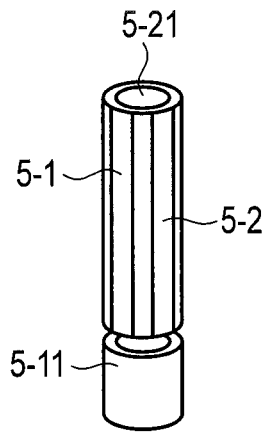
F I G. 4
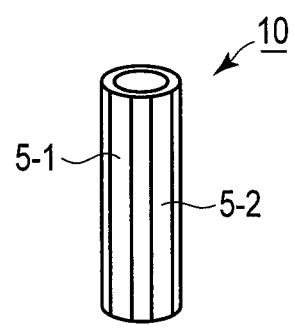
F I G. 5

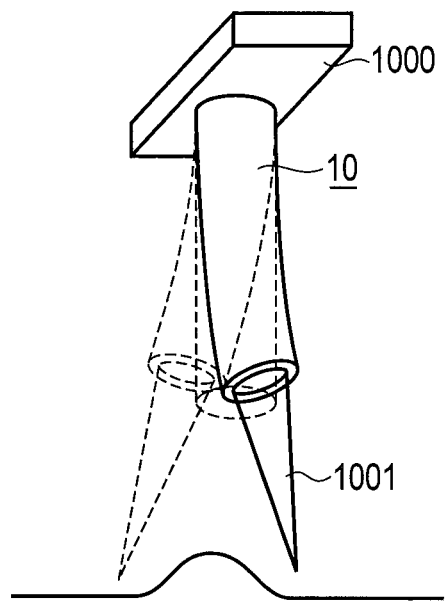
F I G. 6
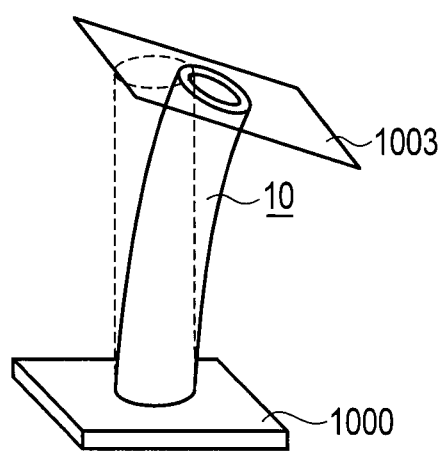
F I G. 7

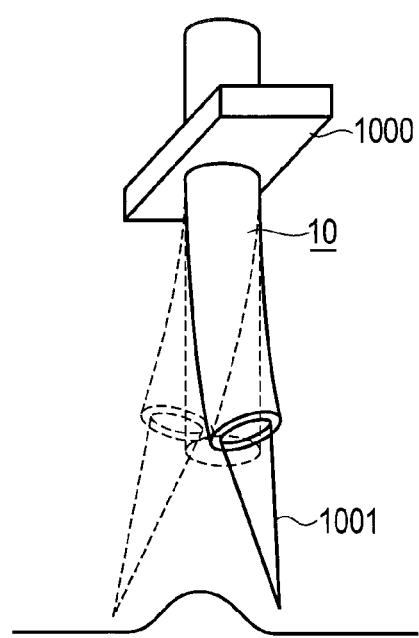
F I G. 8
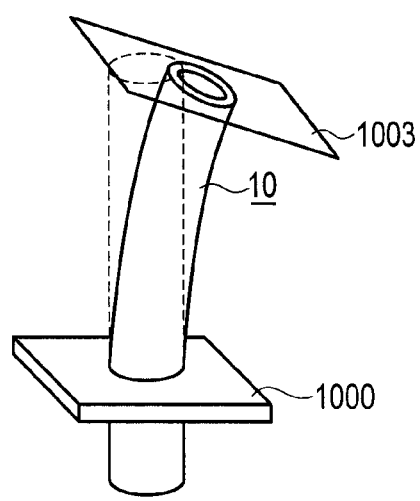
F I G. 9

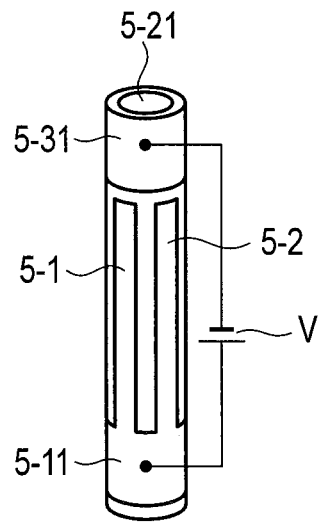
F I G. 12
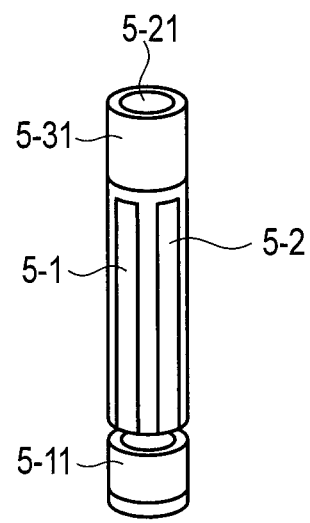
F I G. 13

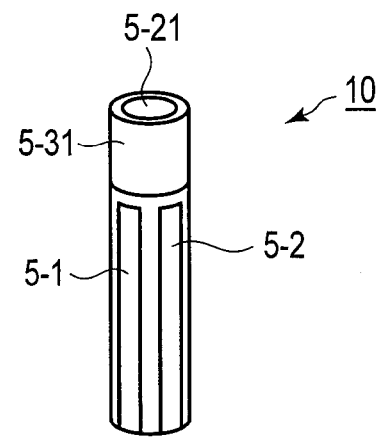
F I G. 14
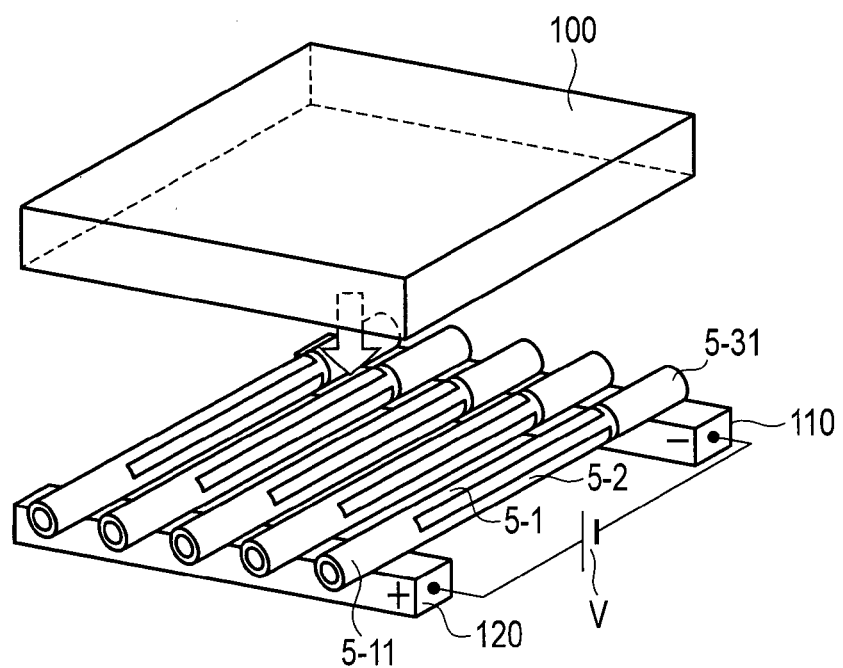
F I G. 15

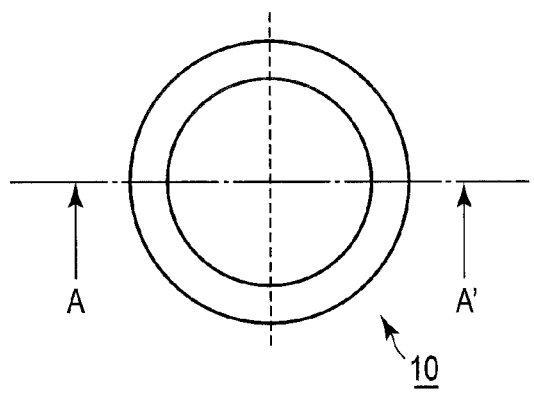
F I G. 16
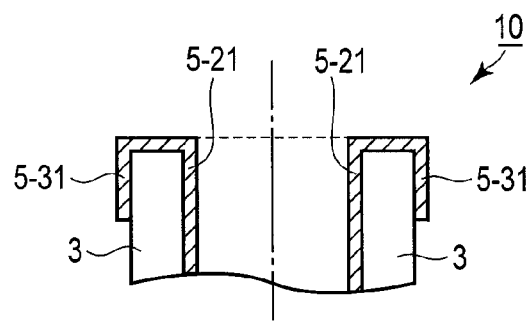
F I G. 17
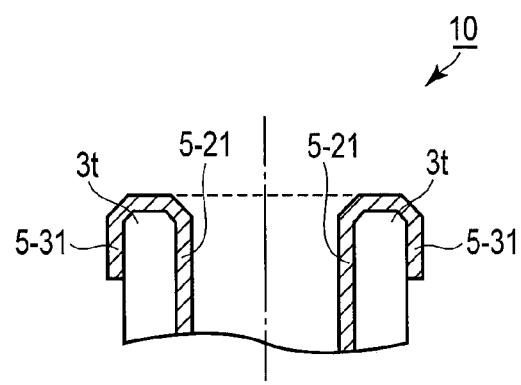
F I G. 18

METHOD OF MANUFACTURING CYLINDRICAL PIEZOELECTRIC ELEMENT

CROSS-REFERENCE TO RELATED APPLICATIONS

This application is a Continuation Application of PCT Application No. PCT/JP2012/075689, filed Oct. 3, 2012 and based upon and claiming the benefit of priority from the prior Japanese Patent Application No. 2011-219148, filed Oct. 3, 2011, the entire contents of which are incorporated herein by reference.

BACKGROUND OF THE INVENTION

1. Field of the Invention

The present invention relates to a manufacturing method of a cylindrical piezoelectric element, cylindrical piezoelectric element, and minute drive mechanism.

2. Description of the Related Art

There has been an ongoing demand to reduce the size of a cylindrical piezoelectric element. However, size reduction of the cylindrical piezoelectric element entails difficulty. In Jpn. Pat. Appln. KOKAI Publication No. 2009-212519, a manufacturing method of a small-sized cylindrical piezoelectric element is disclosed. That is, according to the manufacturing method disclosed in Jpn. Pat. Appln. KOKAI Publication No. 2009-212519, first, a piezoelectric element formed into a cylindrical shape, and having a configuration in which a convex part convex in the radial direction, and having an axial direction as a longitudinal direction is provided on the outer circumferential surface is formed by extrusion molding. Subsequently, a drive electrode is formed on the outer circumferential surface including the convex part, and a reference electrode is formed on the inner circumferential surface. Further, the piezoelectric element is subjected to polarization processing by utilizing the electrodes, and thereafter the convex part is removed by machining. By this series of processes, a cylindrical piezoelectric element provided with drive electrodes divided into a plurality of pieces can be obtained.

BRIEF SUMMARY OF THE INVENTION

However, according to the manufacturing method disclosed in Jpn. Pat. Appln. KOKAI Publication No. 2009-212519, machining of a high degree of accuracy is required in the process of removing the convex part on the outer circumferential surface. When the accuracy of the machining is not satisfactory, there is the possibility of various faults such as a crack in the cylindrical piezoelectric element, short circuit of the drive electrodes, and the like being caused. More specifically, for example, when the removal of the convex part is imperfect, sufficient displacement cannot be obtained when applying a voltage to the drive electrodes in some cases. Further, when the removal machining of the convex part is excessively carried out, and a groove is formed, there is the possibility of a crack in the cylindrical piezoelectric element being caused by deformation at the time of application of a voltage to the drive electrodes.

The present invention has been contrived in view of these circumstances, and an object thereof is to provide a manufacturing method of a cylindrical piezoelectric element realizing size reduction without increasing the degree of difficulty in machining, and to provide a cylindrical piezoelectric element and minute drive mechanism.

To achieve above mentioned object, a manufacturing method of a cylindrical piezoelectric element according to a first aspect of the invention comprises:
  creating a cylindrical piezoelectric material formed by molding a piezoelectric material into a cylindrical shape and by subjecting the molded piezoelectric material to calcination;
  providing a reference electrode on an inner circumferential surface of the cylindrical piezoelectric material;
  providing a plurality of drive electrodes with a predetermined width in a circumferential direction and the drive electrodes extending in an axial direction from one end to the other end on an outer circumferential surface of the cylindrical piezoelectric material;
  providing a polarization electrode at a part of the circumferential surface of the cylindrical piezoelectric material in a vicinity of one end of the cylindrical piezoelectric material in the axial direction in an aspect in which the polarization electrode is electrically connected in series with each of the plurality of drive electrodes in the axial direction;
  applying a predetermined voltage between the polarization electrode and the reference electrode to polarize areas of the cylindrical piezoelectric material corresponding to the plurality of drive electrodes; and
  removing the polarization electrode from the cylindrical piezoelectric material.

To achieve above mentioned object, a cylindrical piezoelectric element according to a second aspect of the invention comprises:
  a plurality of drive electrodes provided on an outer circumferential surface of the cylindrical piezoelectric element substantially at regular intervals in a circumferential direction;
  a reference electrode provided on an inner circumferential surface of the cylindrical piezoelectric element;
  a turnover electrode provided at a part on the outer circumferential surface in a vicinity of one end of the cylindrical piezoelectric element in an axial direction of the cylindrical piezoelectric element, and electrically connected to the reference electrode on the inner circumferential surface; and
  a plurality of areas of piezoelectric activity each of which is a polarized area between each of the drive electrodes and the reference electrode.

To achieve above mentioned object, a minute drive mechanism according to a third aspect of the invention comprises:
  a cylindrical piezoelectric element;
  a fixing member configured to fix one end part of the cylindrical piezoelectric element; and
  a driven member arranged at the other end part of the cylindrical piezoelectric element, wherein
  the cylindrical piezoelectric element comprises
  a plurality of drive electrodes provided on an outer circumferential surface of the cylindrical piezoelectric element substantially at regular intervals in a circumferential direction,
  a reference electrode provided on an inner circumferential surface of the cylindrical piezoelectric element,
  a turnover electrode provided at a part on the outer circumferential surface in a vicinity of one end of the cylindrical piezoelectric element in an axial direction of the cylindrical piezoelectric element, and electrically connected to the reference electrode on the inner circumferential surface, and a plurality of areas of piezoelectric activity each of which is a polarized area between each of the drive electrodes and the reference electrode.

To achieve above mentioned object, a minute drive mechanism according to a fourth aspect of the invention comprises:

a cylindrical piezoelectric element;

fixing member configured to fix a predetermined position on one end side of the cylindrical piezoelectric element; and a driven member arranged at the other end part of the cylindrical piezoelectric element, wherein the predetermined position is a node position in a resonance mode of a system constituted of the cylindrical piezoelectric element and the driven member, and the cylindrical piezoelectric element comprises a plurality of drive electrodes provided on an outer circumferential surface of the cylindrical piezoelectric element substantially at regular intervals in a circumferential direction, a reference electrode provided on an inner circumferential surface of the cylindrical piezoelectric element, a turnover electrode provided at a part on the outer circumferential surface in a vicinity of one end of the cylindrical piezoelectric element in an axial direction of the cylindrical piezoelectric element, and electrically connected to the reference electrode on the inner circumferential surface, and a plurality of areas of piezoelectric activity each of which is a polarized area between each of the drive electrodes and the reference electrode.

Advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 4 is a view showing a "cutting/polishing removal step" in the manufacturing method of a cylindrical piezoelectric element according to the first embodiment of the present invention;

FIG. 5 is a view showing a perspective view of a cylindrical piezoelectric element manufactured by the manufacturing method of a cylindrical piezoelectric element according to the first embodiment of the present invention;

FIG. 6 is a perspective view showing an example in which the cylindrical piezoelectric element according to the first embodiment of the present invention is applied to a small diameter SPM probe;

FIG. 7 is a perspective view showing an example in which the cylindrical piezoelectric element according to the first embodiment of the present invention is applied to a minute stage;

FIG. 8 is a perspective view showing an example in which the cylindrical piezoelectric element according to the first embodiment of the present invention is applied to a small diameter SPM probe;

FIG. 9 is a perspective view showing an example in which the cylindrical piezoelectric element according to the first embodiment of the present invention is applied to a minute stage;

FIG. 12 is a view showing a "polarization step" in the manufacturing method of a cylindrical piezoelectric element according to the second embodiment of the present invention;

FIG. 13 is a view showing a "cutting/polishing removal step" in the manufacturing method of a cylindrical piezoelectric element according to the second embodiment of the present invention;

FIG. 14 is a view showing a perspective view of a cylindrical piezoelectric element manufactured by the manufacturing method of a cylindrical piezoelectric element according to the second embodiment of the present invention;

FIG. 15 is a view showing a device configuration for simultaneously subjecting a plurality of cylindrical piezoelectric materials to polarization processing;

FIG. 16 is a view of the cylindrical piezoelectric element viewed from the end face side;

FIG. 17 is a cross-sectional view of the cylindrical piezoelectric element cut along line A-A' shown in FIG. 16;

FIG. 18 is a cross-sectional view of the cylindrical piezoelectric element cut along line A-A' shown in FIG. 16;

DETAILED DESCRIPTION OF THE INVENTION

First Embodiment

Figure 1:
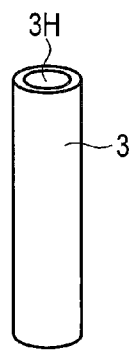
FIG. 1 is a view showing a "molding/calcination step" in the manufacturing method of a cylindrical piezoelectric element according to a first embodiment of the present invention.
Figure 2:
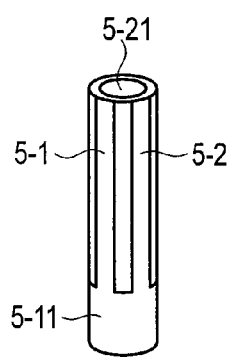
FIG. 2 is a view showing an "external electrode formation step" in the manufacturing method of a cylindrical piezoelectric element according to the first embodiment of the present invention.
Figure 3:
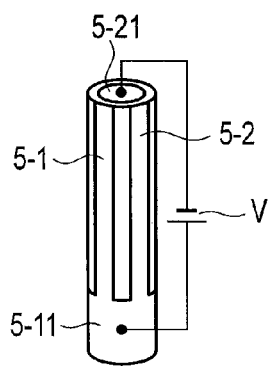
FIG. 3 is a view showing a "polarization step" in the manufacturing method of a cylindrical piezoelectric element according to the first embodiment of the present invention.

Hereinafter, a manufacturing method of a cylindrical piezoelectric element according to a first embodiment of the present invention will be described below with reference to the drawings. FIG. 1 is a view showing a "molding/calcination step (step S1)" in the manufacturing method of a cylindrical piezoelectric element according to the first embodiment of the present invention. FIG. 2 is a view showing an "external electrode formation step (step S2)" in the manufacturing method. FIG. 3 is a view showing a "polarization step (step S3)" in the manufacturing method. FIG. 4 is a view showing a "cutting/polishing removal step (step S4)" in the manufacturing method. FIG. 5 is a view showing a perspective view of a cylindrical piezoelectric element manufactured by the manufacturing method.

First, a piezoelectric material represented by, for example, lead zirconate titanate (PZT) or the like is formed into a cylindrical shape by a method such as molding, cutting, and the like, and is calcined (molding/calcination step), whereby a cylindrical piezoelectric material 3 including a hollow part (through hole) 3H is prepared.

Subsequently, electrodes are formed on the outer circumferential surface and inner circumferential surface of the cylindrical piezoelectric material 3 in the following manner (external electrode formation step). That is, on the outer circumferential surface of the cylindrical piezoelectric material 3, a plurality of drive electrodes 5-1, 5-2 (a total of four drive electrodes including a part not visible in FIG. 2 at regular intervals in the circumferential direction) each having a predetermined width in the circumferential direction and length extending in the axial direction (longitudinal direction of the cylindrical piezoelectric material 3) from one end to the other end are formed.

Furthermore, a polarization electrode 5-11 is formed in such a manner that there is an electrical connection between the polarization electrode 5-11 and all the four drive electrodes, and the polarization electrode 5-11 is positioned in the vicinity of one end of the cylindrical piezoelectric material 3 in the axial direction (in series with each of the plurality of drive electrodes in the axial direction).

On the other hand, a reference electrode 5-21 is formed substantially over the entire inner circumferential surface of the cylindrical piezoelectric material 3.

Here, in the example shown in FIG. 2, although only two drive electrodes, 5-1 and 5-2, are shown, actually, a further two more drive electrodes are provided at a position not visible from the viewpoint of the drawing. More specifically, each of a total of four drive electrodes is provided at each of positions at which the cylindrical piezoelectric material 3 is divided into four equal parts in the circumferential direction.

It should be noted that when a cylindrical piezoelectric element configured to carry out a drive operation in four directions perpendicular to the axial direction of the cylindrical piezoelectric element is to be manufactured, a method of providing four drive electrodes in the above-mentioned aspect is generally used. However, when a cylindrical piezoelectric element of an aspect in which at least two or more drive electrodes are provided is to be manufactured, a particular advantage (to be described later) based on application of the first embodiment can be obtained.

As examples of a material for each of the electrodes to be formed on the inner circumferential surface and outer circumferential surface of the above-mentioned cylindrical piezoelectric material 3, arbitrary conductive materials such as silver, silver-palladium, gold, nickel, and the like can be named. Further, the method for forming each electrode is arbitrary, and, for example, screen printing, sputtering, plating, and the like can be named.

It should be noted that in the external electrode formation step, the order of forming each external electrode is arbitrary.

After completing the above-mentioned external electrode formation step, a predetermined voltage V is applied between the polarization electrode 5-11 and reference electrode 5-21, thereby subjecting the cylindrical piezoelectric material 3 to polarization processing (polarization step). More specifically, it is sufficient if the cylindrical piezoelectric material 3 is polarized by applying a predetermined voltage between the polarization electrode 5-11 and reference electrode 5-21, e.g., by applying, for example, a negative potential to the reference electrode 5-21, and applying a positive potential to the polarization electrode 5-11.

By this polarization step, the parts of the cylindrical piezoelectric material 3 on the inner diameter side of the drive electrodes (parts of the piezoelectric material corresponding to the arrangement parts of the drive electrodes) become an area of piezoelectric activity. This is because the polarization electrode 5-11 is electrically connected to all the drive electrodes, and it is not necessary to carry out polarization processing a plurality of times by using each drive electrode. That is, by carrying out polarization processing between the polarization electrode 5-11 and reference electrode 5-21 only once, polarization processing concerning parts corresponding to all the drive electrodes is completed.

After completing the above polarization step, a part of the cylindrical piezoelectric material 3 at which the polarization electrode 5-11 is formed is cut by, for example, dicing, laser processing, and the like, or the polarization electrode 5-11 is removed by polishing (cutting/polishing removal step). By this cutting/polishing removal step, all the drive electrodes are electrically isolated from each other, and a plurality of areas of piezoelectric activity and a plurality of drive electrodes independent of each other are formed, whereby a cylindrical piezoelectric element 10 shown in FIG. 5 is completed.

As described above, according to the first embodiment, it is possible to provide a manufacturing method of a cylindrical piezoelectric element realizing size reduction without increasing the degree of difficulty in machining, and provide a cylindrical piezoelectric element. That is, according to the manufacturing method of a cylindrical piezoelectric element according to the first embodiment, in the manufacture of a cylindrical piezoelectric element including a plurality of areas of piezoelectric activity, neither calcination of a cylindrical piezoelectric element of a complicated shape is required nor accurate after-machining are required, and furthermore, no securement of connection to a plurality of minute electrodes is required. Accordingly, it is possible to manufacture a small-sized cylindrical piezoelectric element by a simple manufacturing process, and with a high degree of reliability.

Hereinafter, a minute drive mechanism to which a cylindrical piezoelectric element according to the first embodiment is applied will be described. FIG. 6 is a perspective view showing an example in which the cylindrical piezoelectric element according to the first embodiment is applied to a small diameter Scanning Probe Microscope (SPM) probe. FIG. 7 is a perspective view showing an example in which the cylindrical piezoelectric element according to the first embodiment is applied to a minute stage.

That is, in the example shown in FIG. 6, a probe member 1001 is provided at a hollow part (opening part) on one end side of the cylindrical piezoelectric element 10 according to the first embodiment, and the other end thereof is fixed to a supporting part 1000. By such a configuration, a minute drive mechanism (small diameter Scanning Probe Microscope (SPM) probe) in which the probe member 1001 is used as a driven member is realized.

Further, in the example shown in FIG. 7, a flat plate 1003 is provided at one end face of the cylindrical piezoelectric element 10 according to the first embodiment, and the other end thereof is fixed to a supporting part 1000. By such a configuration, a minute stage is realized, and is used for, for example, a scanner mirror or the like.

Hereinafter, an application example in which drive utilizing a resonance phenomenon is carried out will be described with reference to FIG. 8, and FIG. 9.

In the example shown in FIG. 8, a probe member 1001 is provided at a hollow part (opening part) on one end side of the cylindrical piezoelectric element 10 according to the first embodiment, and a predetermined position on the other end side thereof is fixed to a supporting part 1000. By such a configuration, a minute drive mechanism (small diameter Scanning Probe Microscope (SPM) probe) in which the probe member 1001 is used as a driven member is realized.

Further, in the example shown in FIG. 9, a flat plate 1003 is provided at one end face of the cylindrical piezoelectric element 10 according to the first embodiment, and a predetermined position on the other end side thereof is fixed to a supporting part 1000. By such a configuration, a minute stage is realized, and is used for, for example, a scanner mirror or the like.

Here, in each of the examples shown in FIG. 8 and FIG. 9, the position fixed by the supporting part 1000 is a node position in a resonance mode of a system constituted of the cylindrical piezoelectric element 10 and driven member (probe member 1001 or flat plate 1003). When a drive signal of a resonance frequency of the thus configured system constituted of the cylindrical piezoelectric element 10 and driven member (probe member 1001 or flat plate 1003) is applied to each area of piezoelectric activity, it is possible to obtain larger amplitude by utilizing the resonance phenomenon.

Second Embodiment

Hereinafter, a manufacturing method of a cylindrical piezoelectric element according to a second embodiment of the present invention will be described below. It should be noted that in order to avoid a duplicated explanation, only points of difference between the manufacturing method of the cylindrical piezoelectric element according to the second embodiment and that according to the first embodiment will be described. One of the points of difference is the processing in the external electrode formation step and polarization step.

Figure 10:
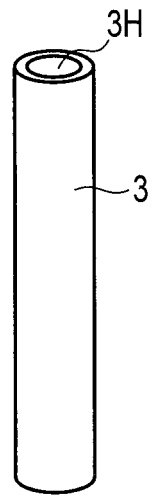
FIG. 10 is a view showing a "molding/calcination step" in the manufacturing method of a cylindrical piezoelectric element according to a second embodiment of the present invention.
Figure 11:
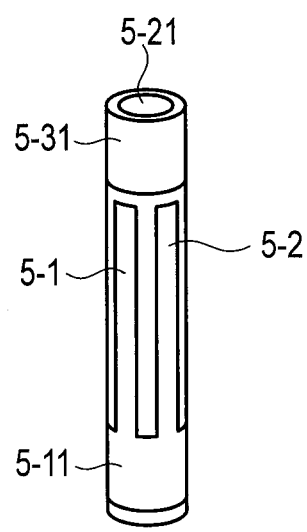
FIG. 11 is a view showing an "external electrode formation step" in the manufacturing method of a cylindrical piezoelectric element according to the second embodiment of the present invention.

FIG. 10 is a view showing a "molding/calcination step (step S1)" in the manufacturing method of the cylindrical piezoelectric element according to the second embodiment of the present invention. FIG. 11 is a view showing an "external electrode formation step (step S2)" in the manufacturing method. FIG. 12 is a view showing a "polarization step (step S3)" in the manufacturing method. FIG. 13 is a view showing a "cutting/polishing removal step (step S4)" in the manufacturing method. FIG. 14 is a view showing a perspective view of the cylindrical piezoelectric element manufactured by the manufacturing method.

First, like the first embodiment, a cylindrical piezoelectric material 3 including a hollow part (through hole) 3H is prepared in the "molding/calcination step" (see FIG. 10), and subsequently, external electrodes are formed on the outer circumferential surface and inner circumferential surface of the cylindrical piezoelectric material 3 in the "external electrode formation step" (see FIG. 11). In this "external electrode formation step", a reference electrode 5-21 is formed on the inner circumferential surface of the cylindrical piezoelectric material 3, and a plurality of drive electrodes, polarization electrode 5-11, and "turnover electrode 5-31" specific to the second embodiment are formed on the outer circumferential surface.

The turnover electrode 5-31 is formed integrally with (electrically continuous with) the reference electrode 5-21 on the inner circumferential surface of the cylindrical piezoelectric material 3 at an end part of the cylindrical piezoelectric material 3 on the opposite side of the end part at which the polarization electrode 5-11 is provided. In other words, an electrode formed by extending the reference electrode 5-21 on the inner circumferential surface of the cylindrical piezoelectric material 3 to the outer circumferential surface thereof is the turnover electrode 5-31.

Further, in the polarization step, a predetermined voltage V is applied between the turnover electrode 5-31 and polarization electrode 5-11 (see FIG. 12). Therefore, according to the manufacturing method of a cylindrical piezoelectric element according to the second embodiment, it is possible to carry out polarization processing by utilizing only the external electrodes on the outer circumferential surface of the cylindrical piezoelectric material 3. That is, electrical connection for the polarization processing is facilitated (electrical connection configuration is simplified).

After completing the above-mentioned polarization step, a part of the cylindrical piezoelectric material 3 at which the polarization electrode 5-11 is formed is cut by, for example, dicing, laser processing, and the like, or the polarization electrode 5-11 is removed by polishing, by the "cutting/polishing removal step" in the same manner as the first embodiment. Thereby, a cylindrical piezoelectric element 10 shown in FIG. 14 is completed.

It should be noted that as shown in FIG. 15, by utilizing the turnover electrode 5-31, it is possible to simultaneously subject a plurality of cylindrical piezoelectric materials 3 to polarization processing. FIG. 15 is a view showing the device configuration for simultaneously subjecting a plurality of cylindrical piezoelectric materials 3 to polarization processing. As shown in FIG. 15, two bar-like electrodes 110 and 120 are arranged in parallel with each other, and a plurality of cylindrical piezoelectric materials 3 are placed on the bar-like electrodes 110 and 120 to thereby bridge the bar-like electrodes 110 and 120.

Furthermore, the plurality of cylindrical piezoelectric materials 3 are pressed from above by means of a pressing member such as an insulating elastic member 100 or the like. It should be noted that the operation of pressing the cylindrical piezoelectric materials 3 using the pressing member is carried out simply for positional fixation, and need not necessarily be carried out.

Further, by applying a predetermined voltage V (polarization voltage) between the bar-like electrode 110 and bar-like electrode 120, it is possible to collectively subject all the cylindrical piezoelectric materials 3 to polarization processing. By carrying out polarization processing in the aspect shown in FIG. 15, a jig used to apply a voltage to the reference electrode on the inner circumferential surface of the cylindrical piezoelectric material 3 is made unnecessary, and furthermore, positioning is facilitated.

FIG. 16 is a view of the cylindrical piezoelectric element 10 viewed from the end face side. Each of FIG. 17, and FIG. 18 is a cross-sectional view of the cylindrical piezoelectric element 10 cut along line A-A' shown in FIG. 16. In the example shown in FIG. 17, the reference electrode 5-21 and turnover electrode 5-31 are provided in a state where the end face of the cylindrical piezoelectric material 3 is not particularly subjected to processing. In the example shown in FIG. 18, the end face of the cylindrical piezoelectric material 3 is subjected to chamfering, and a chamfered part 3t is formed; thereafter, the reference electrode 5-21, and turnover electrode 5-31 are provided.

By the configuration shown in FIG. 18, it is possible to previously prevent electrical continuity between the reference electrode 5-21 and turnover electrode 5-31 from being lost by the abrasive loss of the edge part of the end face of the cylindrical piezoelectric element 10 caused by, for example, wear or the like.

As described above, according to the second embodiment, not only the same advantage as the manufacturing method of a cylindrical piezoelectric element and cylindrical piezoelectric element according to the first embodiment is obtained, but also electrical connection for polarization processing can be carried out only on the outer circumferential surface of the cylindrical piezoelectric material, and hence it is possible to further simplify the "polarization step".

It should be noted that although the completed cylindrical piezoelectric element 10 includes the turnover electrode 5-31 as shown in FIG. 14, it goes without saying that the turnover electrode 5-31 may also be cut off. However, when the turnover electrode 5-31 is left, it is not necessary to bring the probe into contact with the reference electrode 5-21 on the inner circumferential surface at the time of drive of the cylindrical piezoelectric element 10. That is, by utilizing the turnover electrode 5-31, it becomes possible to drive the cylindrical piezoelectric element 10 without using the external electrode (reference electrode 5-21) on the inner circumferential surface of the cylindrical piezoelectric element 10.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a cylindrical piezoelectric element, the method comprising:
    providing a cylindrical piezoelectric material comprising a piezoelectric material having a cylindrical shape, wherein the piezoelectric material having the cylindrical shape is subjected to calcination;
    forming a reference electrode on an inner circumferential surface of the cylindrical piezoelectric material;
    forming a plurality of drive electrodes on an outer circumferential surface of the cylindrical piezoelectric material such that the plurality of drive electrodes extend in an axial direction of the cylindrical piezoelectric material from a vicinity of a first end towards a second end of the cylindrical piezoelectric material;
    forming a polarization electrode on a part of the outer circumferential surface of the cylindrical piezoelectric material in a vicinity of the second end of the cylindrical piezoelectric material in the axial direction such that the polarization electrode is electrically connected in series with all the plurality of drive electrodes in the axial direction;
    applying a predetermined voltage between the polarization electrode and the reference electrode to polarize areas of the cylindrical piezoelectric material corresponding to the plurality of drive electrodes; and
    removing the polarization electrode.

2. The method according to claim 1, further comprising:
    forming the reference electrode to further extend continuously from the inner circumferential surface of the cylindrical piezoelectric material to a part of the outer circumferential surface of the cylindrical piezoelectric material in the vicinity of the first end of the cylindrical piezoelectric material.

3. The method according to claim 2, wherein the applying the predetermined voltage comprises:
    arranging a first bar-shaped electrode and a second bar-shaped electrode substantially in parallel with each other;
    placing the polarization electrode in electrical contact with the first bar-shaped electrode;
    placing the reference electrode extending to the part on the outer circumferential surface of the cylindrical piezoelectric material in electrical contact with the second bar-shaped electrode; and
    applying the predetermined voltage between the first bar-shaped electrode and the second bar-shaped electrode.

4. The method according to claim 1, wherein forming the plurality of drive electrodes on the outer circumferential surface of the cylindrical piezoelectric material comprises forming the plurality of drive electrodes such that each drive electrode has a predetermined width in a circumferential direction of the cylindrical piezoelectric material.

5. The method according to claim 1, wherein removing the polarization electrode comprises removing the polarization electrode and the part of the outer circumferential surface of the cylindrical piezoelectric material in the vicinity of the second end of the cylindrical piezoelectric material on which the polarization electrode is formed.

* * * * *